United States Patent
Pun et al.

(10) Patent No.: US 9,974,188 B2
(45) Date of Patent: May 15, 2018

(54) PATTERNING OF GRAPHENE CIRCUITS ON FLEXIBLE SUBSTRATES

(71) Applicant: Compass Technology Company Limited, Hong Kong (HK)

(72) Inventors: Kelvin Po Leung Pun, Hong Kong (HK); Chee Wah Cheung, Hong Kong (HK)

(73) Assignee: Compass Technology Company Limited, Shatin (HK)

( * ) Notice: Subject to any disclaimer, the term of this patent is extended or adjusted under 35 U.S.C. 154(b) by 0 days. days.

(21) Appl. No.: 15/090,703

(22) Filed: Apr. 5, 2016

(65) Prior Publication Data

US 2017/0290167 A1 Oct. 5, 2017

(51) Int. Cl.
| | |
|---|---|
| H05K 1/09 | (2006.01) |
| H05K 3/00 | (2006.01) |
| H05K 1/02 | (2006.01) |
| H05K 1/03 | (2006.01) |

(52) U.S. Cl.
CPC ......... *H05K 3/0041* (2013.01); *H05K 1/0278* (2013.01); *H05K 1/0306* (2013.01); *H05K 1/0326* (2013.01); *H05K 1/0346* (2013.01); *H05K 1/09* (2013.01); *H05K 2201/0141* (2013.01); *H05K 2201/0145* (2013.01); *H05K 2201/0154* (2013.01); *H05K 2201/0323* (2013.01)

(58) Field of Classification Search
CPC .......... B41F 5/24; B41F 27/00; B41F 27/005; B41F 33/0081; B41P 2233/52; G09G 3/36; G06F 3/045; H05K 1/09; H05K 1/0278; H05K 1/0306; H05K 1/0326; H05K 1/0346; H05K 3/0041; H05K 2201/0141; H05K 2201/0145; H05K 2201/0154; H05K 2201/0323
USPC .......... 101/481, 485; 174/257; 345/104, 174
See application file for complete search history.

(56) References Cited

U.S. PATENT DOCUMENTS

| | | | |
|---|---|---|---|
| 7,070,923 B1 * | 7/2006 | Loftus | A61L 27/08 424/78.17 |
| 8,241,992 B2 | 8/2012 | Clevenger et al. | |
| 9,012,882 B2 | 4/2015 | Duan et al. | |
| 9,087,692 B2 | 7/2015 | Accandi et al. | |
| 2007/0190296 A1 * | 8/2007 | Yoshikawa | B32B 3/00 428/195.1 |

(Continued)

*Primary Examiner* — Timothy Thompson
*Assistant Examiner* — Guillermo Egoavil
(74) *Attorney, Agent, or Firm* — Saile Ackerman LLC; Stephen B. Ackerman; Rosemary L. S. Pike (57) ABSTRACT

A process for forming a graphene circuit pattern on an object is described. A graphene layer is grown on a metal foil. A bonding layer is formed on a protective film and a surface of the bonding layer is roughened. The graphene layer is transferred onto the roughened surface of the bonding layer. The protective film is removed and the bonding layer is laminated to a first core dielectric substrate. The metal foil is etched away. Thereafter the graphene layer is etched using oxygen plasma etching to form graphene circuits on the first core dielectric substrate. The first core dielectric substrate having graphene circuits thereon is bonded together with a second core dielectric substrate wherein the graphene circuits are on a side facing the second core dielectric substrate wherein an air gap is left therebetween.

24 Claims, 7 Drawing Sheets

(56) References Cited

U.S. PATENT DOCUMENTS

| | | | |
|---|---|---|---|
| 2008/0252799 A1* | 10/2008 | Lee | G02B 5/3058 |
| | | | 349/5 |
| 2010/0220074 A1* | 9/2010 | Irvin, Jr. | G06F 3/045 |
| | | | 345/174 |
| 2015/0033968 A1* | 2/2015 | Derichs | B41F 27/005 |
| | | | 101/481 |
| 2015/0228859 A1* | 8/2015 | Morreale | H01L 51/5296 |
| | | | 257/29 |

* cited by examiner

PATTERNING OF GRAPHENE CIRCUITS ON FLEXIBLE SUBSTRATES

TECHNICAL FIELD

This application relates to processes of forming a circuit pattern on an object, and more particularly to a process of forming a graphene circuit pattern on flexible substrates, such as Polyimide (PI), Liquid Crystal Polymer (LCP) and Cyclo-olefin polymers (COP).

BACKGROUND

Graphene applications on flexible substrates have advantages in photonics, optoelectronics and organic electronics such as in light-emitting diodes and touch screen technology due to their unique electrical, mechanical, optical and thermal properties. Excellent electrical conductivity, thermal conductivity, and chemical resistance make graphene a perfect material for replacing copper as circuits. Massive flexible graphene circuit manufacturing can be achieved by transferring graphene onto flexible substrates and performing plasma etching afterwards. Chemical Vapor Deposition (CVD) graphene can be transferred onto flexible substrates as good quality raw material for patterning circuits. It is proved that CVD graphene has good adhesion on commonly used base films PI and LCP, which allows the possibility of manufacturing graphene circuits by oxygen plasma etching.

A conventional transfer method includes the following steps of: grow CVD graphene on a metal foil, usually copper; covering a thermo-releasable material on the graphene film, followed by pressing and peeling off the thermo-releasable material on the graphene film so as to attach the graphene film thereon; and covering the thermo-releasable material together with the graphene film on the planar surface of the object, followed by heating so as to directly attach the graphene film onto the planar surface of the object; and modifying the graphene surface by plasma etching to form circuits is performed using reel to reel format afterwards.

Compared to conventional copper circuits, graphene circuits on PI, LCP and COP offer significantly improved electrical conductivity, thermal conductivity and chemical resistance. U.S. Pat. No. 8,241,992 (Clevenger et al), U.S. Pat. No. 9,012,882 (Duan et al), and U.S. Pat. No. 9,087,692 (Accardi et al) teach graphene patterning methods.

SUMMARY

It is an object of the present disclosure to provide an improved graphene circuit board with improved electrical conductivity, thermal conductivity and chemical resistance.

Yet another object of the present disclosure is to provide an improved graphene circuit board that can be embedded within the substrate with an air gap to provide electrical connections.

A further object is to provide an improved graphene circuit board having a reduction in overall thickness.

In accordance with the objectives of the present disclosure, a process for forming a graphene circuit pattern on an object is achieved. A graphene layer is grown on a metal foil. A cover film is laminated onto the graphene layer. The metal foil is etched away and the graphene layer is transferred onto a first core dielectric substrate. Thereafter the graphene layer is etched using oxygen plasma etching to form graphene circuits on the first core dielectric substrate. The first core dielectric substrate having graphene circuits thereon is bonded together with a second core dielectric substrate wherein the graphene circuits are on a side facing the second core dielectric substrate wherein an air gap is left therebetween.

Also in accordance with the objective of the present disclosure, a graphene circuit board is achieved comprising two core dielectric substrates having graphene patterns thereon wherein the two substrates are bonded together wherein an air gap is formed therebetween.

BRIEF DESCRIPTION OF THE DRAWINGS

In the accompanying drawings forming a material part of this description, there is shown.

DETAILED DESCRIPTION

The present disclosure aims to overcome the shortcomings of the existing flexible printed circuit board to provide a new graphene circuit board with improved electrical conductivity, thermal conductivity and chemical resistance. The graphene pattern or circuit can be embedded within the substrate with an air gap to provide electrical connections. It also offers excellent flexibility by reduction in overall thickness for use in the coming wearable electronics devices, fingerprint sensors, flexible displays, and touch screen panels.

Two preferred embodiments of the present disclosure are described with respect to FIGS. 1A-1H and 1J and FIGS. 2A-2H and 2J. Referring now more particularly to FIGS. 1A-1H and 1J, the first preferred embodiment will be described.

Figure 1A:
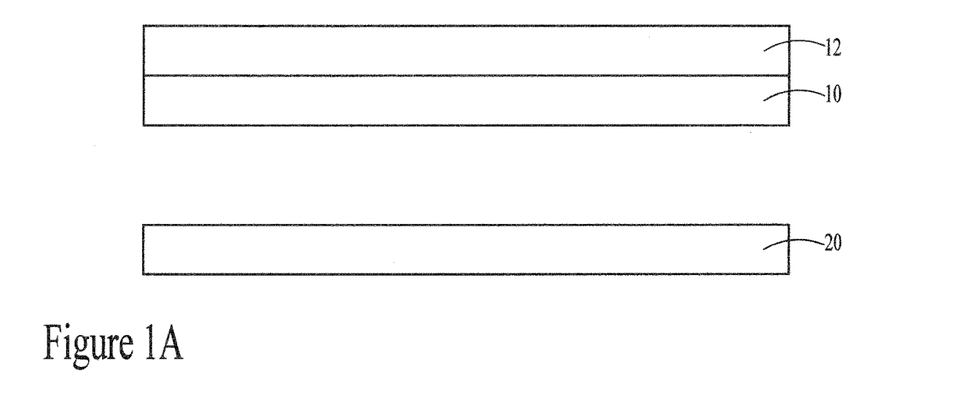
FIGS. 1A-1H and 1J are cross-sectional representations of steps in a first preferred embodiment of the present disclosure.

The target substrate 20, shown in FIG. 1A, is preferably a core dielectric substrate. For example, the dielectric core material may be Polyimide (PI), Liquid Crystal Polymer (LCP), polyester (PET), polyethylene-naphthalate (PEN), laminates of epoxies or Bismaleimide-Triazine resin (BT), Teflon, modified Teflon, ceramic, or Cyclo-olefin Polymers (COP). The target substrate preferably has a thickness of between about 2 microns and 2000 microns.

Also shown is a base layer 12 such as polyester (PET) on which is formed the bonding film 10. The bonding film 10 can be any kind of thermoset adhesive film reinforced with fibers, such as epoxy, cyanide ester, acrylic adhesive, etc. The fibers can be glassy fiber, or aramide paper, etc. The adhesive film will have a low coefficient of thermal expansion (CTE) of less than about 46 and a high glass transition temperature (Tg) of more than about 200 degrees C.

One of the bonding film candidates is ABF (Ajinomoto Bonding Film), an epoxy resin-based adhesive film consisting of:

Bisphenol A epoxy resin: 9 wt. %
Petroleum naphtha: under 5.0 wt. %

Cyclohexanone: 1.1 wt. %
N,N-dimethylformamide: 0.5 wt. %
Toluene: under 5.0 wt. %
Ethanol: under 5.0 wt. %
Methyl ethyl ketone: under 5.0 wt. %
Silica powder: 30~40 wt. %

Another bonding film candidate is Dupont FR0100 bonding film made of modified acrylic:

N,N'-ethylenebis: >=10–<20%
Antimoney trioxide: >=1–<10%
Phenol: >=0, 1–<0, 25%

Other possibilities are Katpon/Acrylic, LCP, or unreacted thermal cure resin.

Figure 1B:
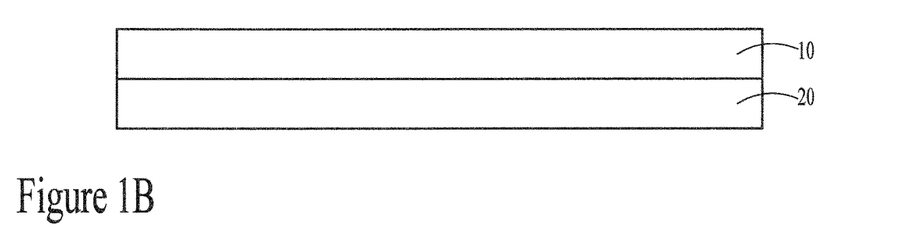

As shown in FIG. 1B, the substrate 20 and the bonding film 10 are laminated and the PET film 12 is peeled off. The PET film is a protective layer to prevent damage to the bonding film during lamination.

Figure 1C:
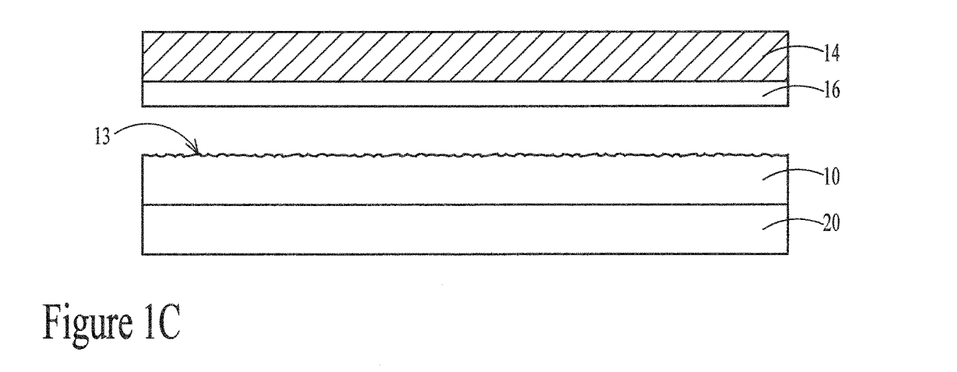

Now, as shown in FIG. 1C, a chemical vapor deposition (CVD) graphene layer 16 is formed on a metal foil 14. The metal foil may be copper, aluminum, gold, Titanium/tungsten, or silver. A graphene monolayer 16 is grown on the metal foil by CVD. For example, copper foil at room temperature and very low pressure and in the presence of small amounts of methane produces high quality graphene. The growth automatically stops after a single layer forms.

Also shown in FIG. 1C is a roughening 13 of the surface of the bonding film 10. The pre-treatment of bonding film 10 plays an important role to roughen the surface of the bonding film prior to graphene transfer. Surface modification of the bonding film can be performed by chemical roughening; for example, by treating the surface with potassium permanganate, or by dry etching the bonding layer using oxygen plasma. If the surface of the bonding film is not roughened prior to graphene transfer, the graphene is in danger of detaching from the bonding film.

Figure 1D:
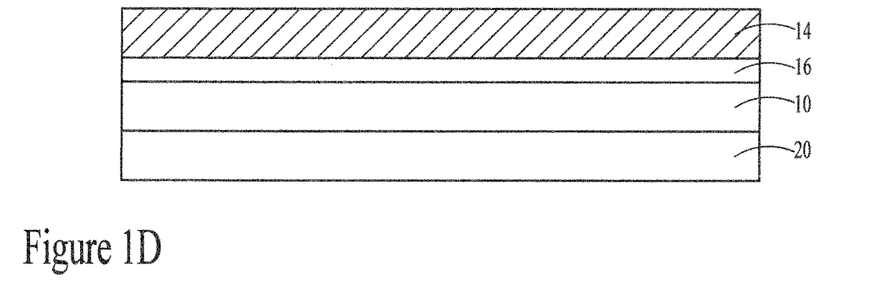

Next, the roughened bonding film 10 is laminated onto the graphene/metal surface by a hot press process, as shown in FIG. 1D. For example, roller lamination with temperature and pressure applied is used. Currently in this field, most researchers use PMMA as the medium to transfer graphene. In the present disclosure, we prefer to use a bonding film material to avoiding using PMMA. Among the advantages of the bonding film over PMMA are 1) the bonding film is a dielectric material, thus it has a low Dk and low loss characteristic, suitable for high speed and high frequency applications of various electrical devices, 2) the bonding film is also able to have its surface chemically roughened to enhance interfacial adhesion of graphene to the target substrate to prevent delamination, and 3) the bonding film can be laminated in a reel to reel process in a designated format, making it suitable for high volume production. In contrast, PMMA cannot achieve the above.

Figure 1E:
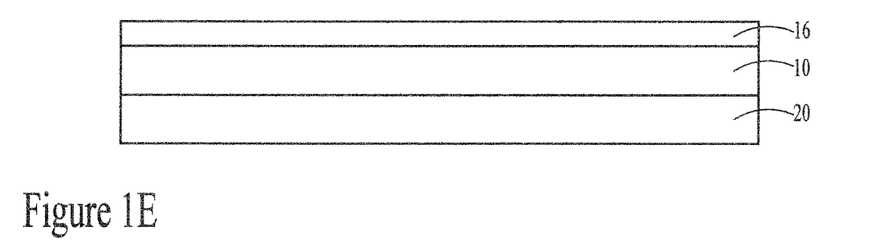

Referring now to FIG. 1E, the metal layer 14 is chemically etched away, for example, by $FeCl_3$ using high pressure in a reel to reel process.

Now, oxygen plasma etching is performed to form graphene circuits in the transferred graphene. Etching the graphene after it has been transferred to the substrate provides better fine line width definition and spacing than if the etching were performed prior to transfer; also better alignment accuracy can be achieved with the support of fiducial marks.

Figure 1F:
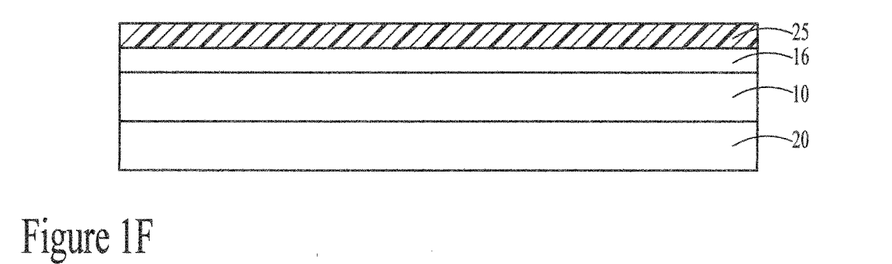
Figure 1G:
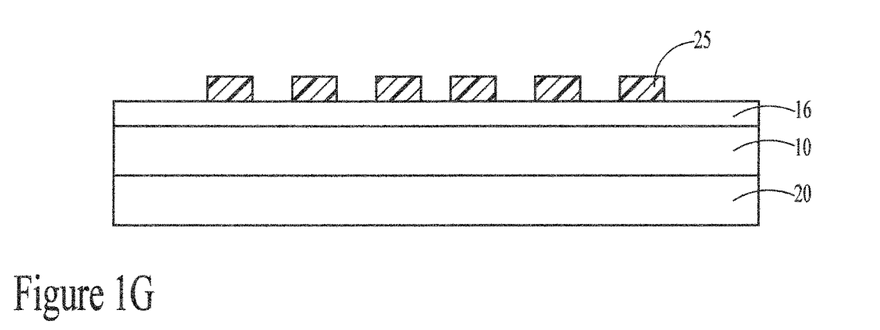

First, a dry film or photo-resist 25 is applied on the graphene surface to provide a protection for the desired graphene from plasma etching as shown in FIG. 1F. A glass mask is used to apply photolithography to form desired pattern 25. This is shown in FIG. 1G.

Figure 1H:
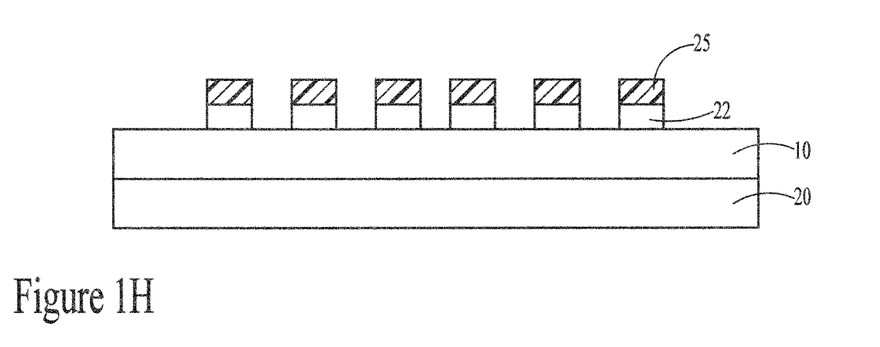
Figure 1J:
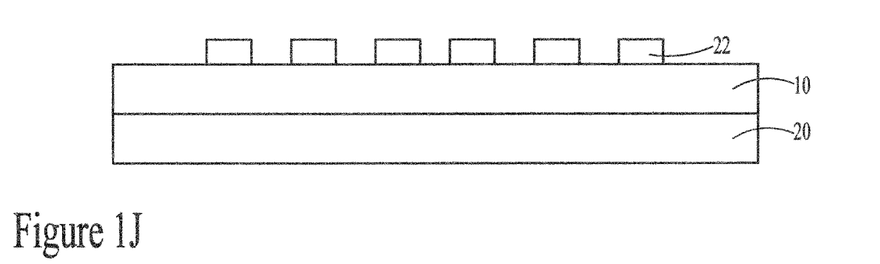

Preferably, plasma etching is conducted by a reel to reel format oxygen plasma etching machine. When the graphene pattern is formed at high density on top of a bonding film of the target substrate in a reel to reel process, the pitch can be reduced to 15 μm with 7.5 μm line and 7.5 μm spacing. The patterned graphene 22 is shown in FIG. 1H. More preferably, after etching, the dry film or photo-resist is removed from the patterned graphene layer, as shown in FIG. 1J. The reel to reel process offers higher yield and lower production costs than a conventional panel process for forming conventional circuits.

Referring now more particularly to FIGS. 2A-2H and 2J, the second preferred embodiment will be described.

Figure 2A:
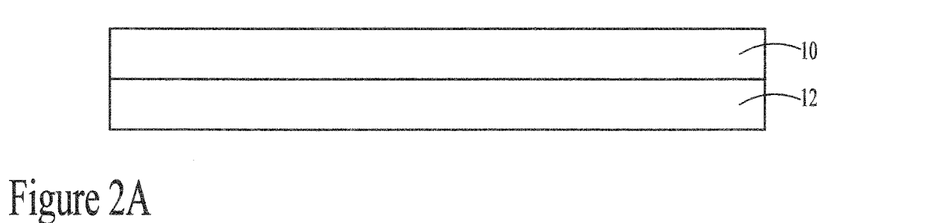
FIGS. 2A-2H and 2J are cross-sectional representations of steps in a second preferred embodiment of the present disclosure.

FIG. 2A shows a base layer 12 such as polyester (PET) on which is formed the bonding film 10. The bonding film 10 can be any kind of thermoset adhesive film reinforced with fibers, such as epoxy, cyanide ester, acrylic adhesive, etc. The fibers can be glassy fiber, or aramide paper, etc. The adhesive film will have a low coefficient of thermal expansion (CTE) of less than about 46 and a high glass transition temperature (Tg) of more than about 200 degrees C. The same preferred bonding film candidates as were discussed above can be used for this bonding film 10.

Figure 2B:
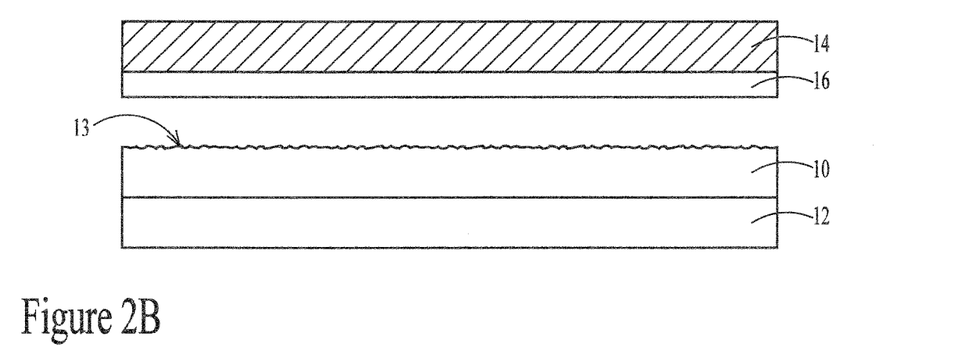

Now, as shown in FIG. 2B, a chemical vapor deposition (CVD) graphene layer 16 is formed on a metal foil 14. The metal foil may be copper, aluminum, gold, Titanium/tungsten, or silver. A graphene monolayer 16 is grown on the metal foil by CVD. For example, copper foil at room temperature and very low pressure and in the presence of small amounts of methane produces high quality graphene. The growth automatically stops after a single layer forms.

Also shown in FIG. 2B is a roughening 13 of the surface of the bonding film 10. The pre-treatment of bonding film 10 plays an important role to roughen the surface of the bonding film prior to graphene transfer. Surface modification of the bonding film can be performed by chemical roughening; for example, by treating the surface with potassium permanganate, or by dry etching the bonding layer using oxygen plasma.

Figure 2C:
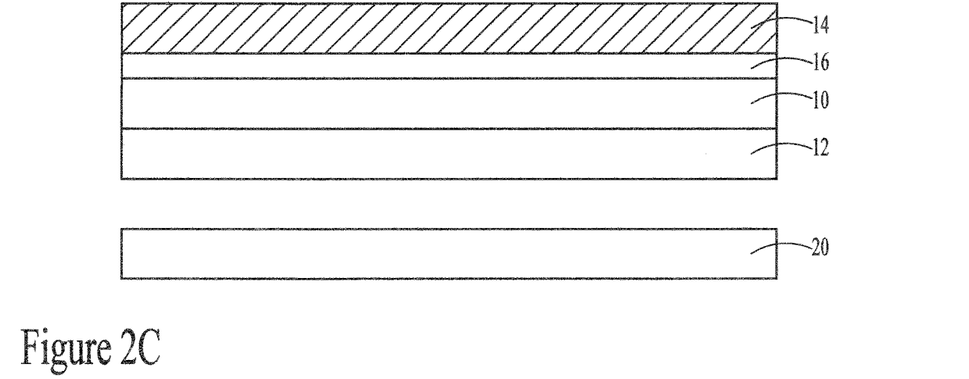
Figure 2D:
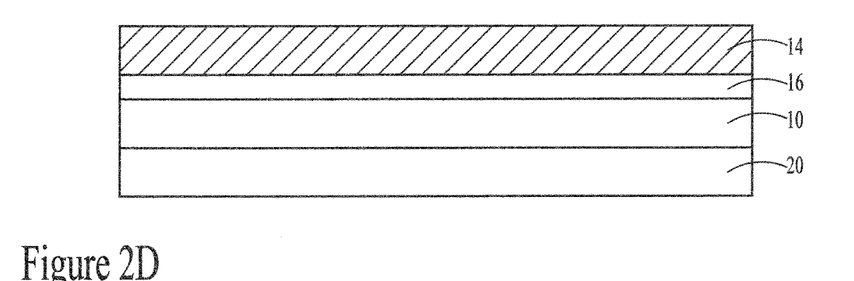

As shown in FIG. 2C, the roughened bonding film 10 is laminated onto the graphene/metal surface by a hot press process, as shown in FIG. 2D. For example, roller lamination with temperature and pressure applied is used.

FIG. 2C also shows the target substrate 20, preferably a core dielectric substrate. For example, the dielectric core material may be Polyimide (PI), Liquid Crystal Polymer (LCP), polyester (PET), polyethylene-naphthalate (PEN), laminates of epoxies or Bismaleimide-Triazine resin (BT), Teflon, modified Teflon, ceramic, or Cyclo-olefin Polymers (COP). The target substrate preferably has a thickness of between about 2 microns and 2000 microns.

The PET film 12 is peeled off, and then the substrate 20 and the bonding film 10 are laminated together, as shown in FIG. 2D.

Figure 2E:
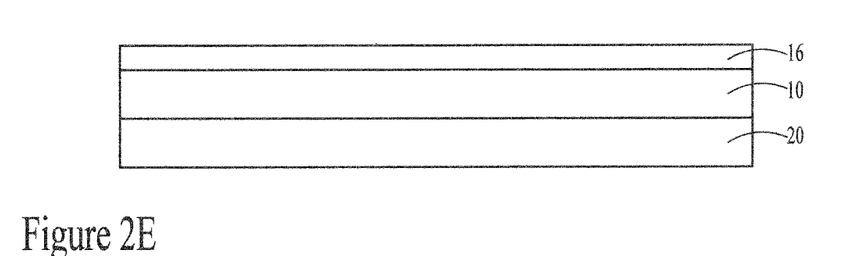

Referring now to FIG. 2E, the metal layer 14 is chemically etched away, for example, by $FeCl_3$ using high pressure in a reel to reel process.

Now, oxygen plasma etching is performed to form graphene circuits in the transferred graphene. Etching the graphene after it has been transferred to the substrate provides better fine line width definition and spacing than if the etching were performed prior to transfer; also better alignment accuracy can be achieved with the support of fiducial marks.

Figure 2F:
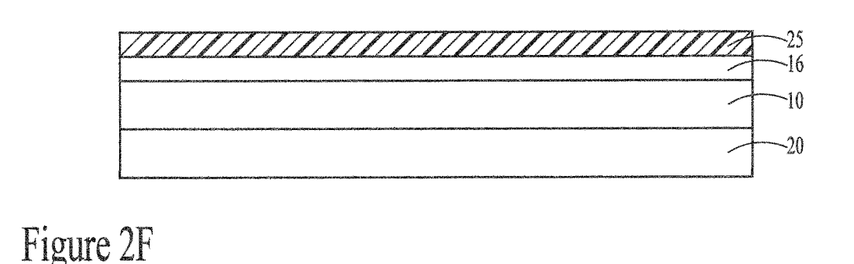
Figure 2G:
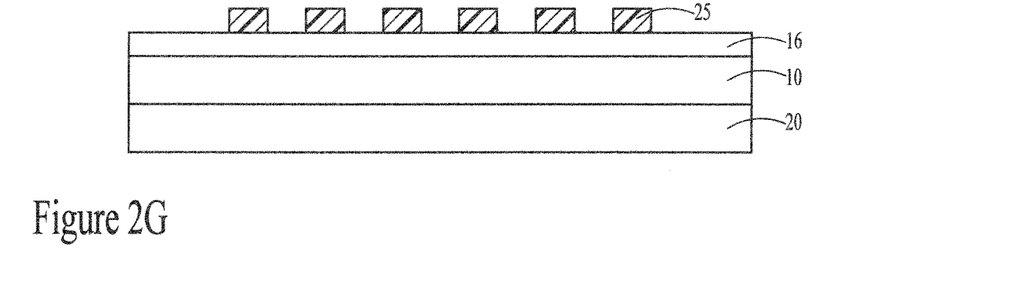

First, a dry film or photo-resist 25 is applied on the graphene surface to provide a protection for the desired graphene from plasma etching as shown in FIG. 2F. A glass mask is used to apply photolithography to form desired pattern 25. This is shown in FIG. 2G.

Figure 2H:
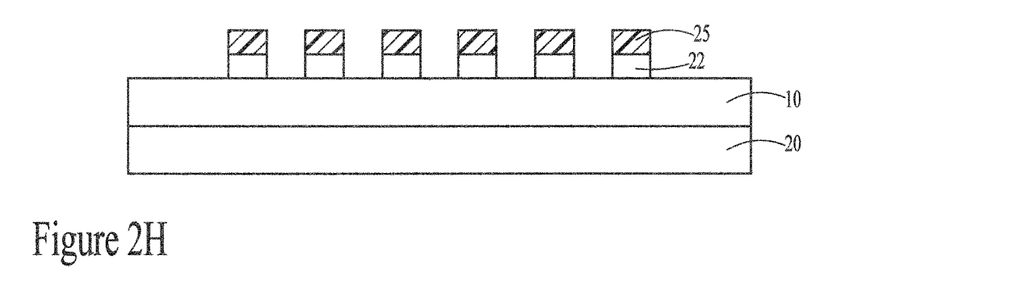
Figure 2J:
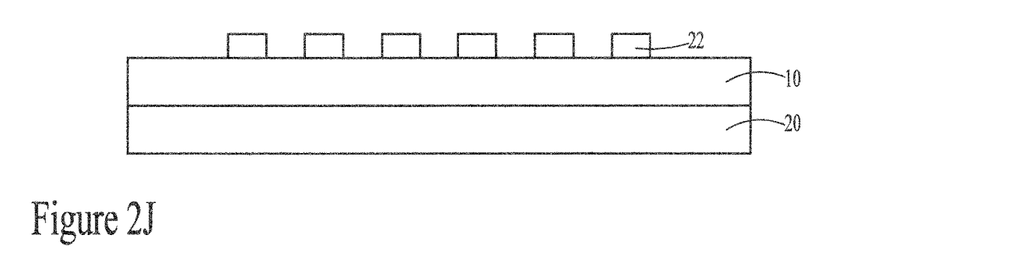

Preferably, plasma etching is conducted by a reel to reel format oxygen plasma etching machine. The patterned graphene 22 is shown in FIG. 2H. More preferably, after etching, the dry film or photo-resist is removed from the patterned graphene layer, as shown in FIG. 2J.

Figure 3:
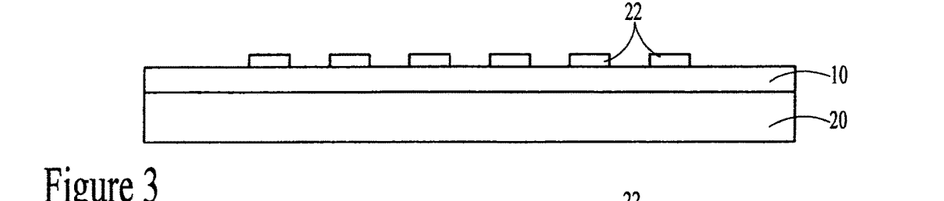
FIG. 3 is a cross-sectional view of graphene circuits in a first preferred embodiment of the present disclosure.

FIG. 3 is a cross-sectional view of the completed graphene circuits 22 patterned on one side of core dielectric substrate 20. In this and following figures, 20 may include a bonding film on the core dielectric substrate, as described above. Preferably, the graphene circuits form a monolayer on the substrate. The graphene circuits may be electrodes. Alternatively, the graphene pattern may be a film or paste type material that has transferred to the substrate. For example, this is shown as 26 in FIG. 6.

Figure 4:
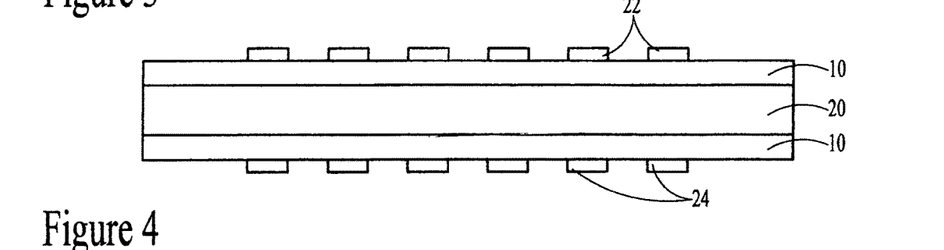
FIG. 4 is a cross-sectional view of graphene circuits in a second preferred embodiment of the present disclosure.

FIG. 4 is a cross-sectional view of graphene circuits 22 and 24 patterned on both sides of the substrate 20. The substrate may be sandwiched by two monolayer of graphene pattern.

In FIGS. 3 and 4, the substrate dielectric material is approximately 2 to 200 μm in thickness. The dielectric material can be very flexible or rigid. If the thickness is under 200 μm, then it is still a flexible substrate. Furthermore, each monolayer of graphene has a thickness of between about 0.3 and 3 μm.

Figure 6:
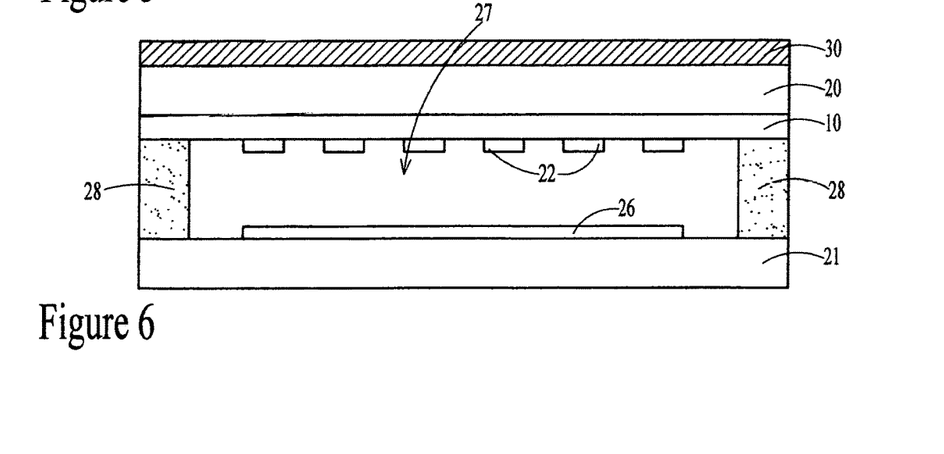
FIG. 6 is a cross-sectional view of graphene circuits in a fourth preferred embodiment of the present disclosure.

The core dielectric substrate 20 may further be laminated with one or more conductive metal layers 30 on a side of the substrate opposite to the graphene patterned side, as shown in FIG. 6. These metal layers may comprise copper (Cu), Silver (Ag), Palladium (Pd), Aluminium (Al), Titanium-Tungsten (TiW), and/or Gold (Au).

Figure 5:
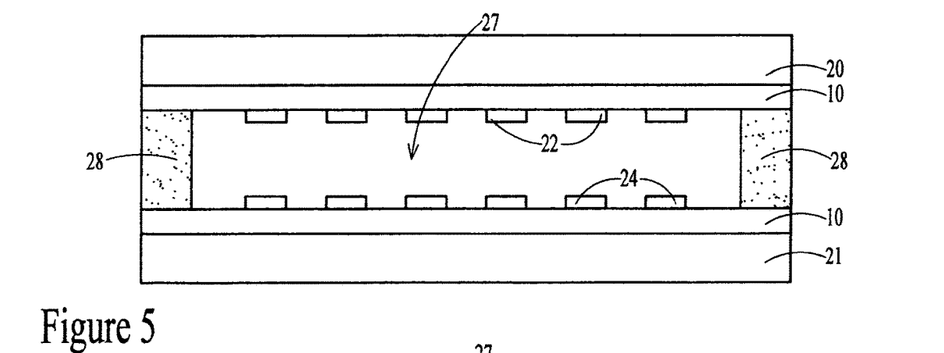
FIG. 5 is a cross-sectional view of graphene circuits in a third preferred embodiment of the present disclosure.

Now, the graphene substrate can be used in a variety of applications, such as for wearable electronic devices, fingerprint sensors, flexible displays, and touch screen panels. For example, two core dielectric substrates 20 and 21 with graphene patterns 22 and 24, respectively, can be bonded with the graphene sides facing each other, as shown in FIG. 5. The substrates are bonded together with adhesion 28, leaving an air gap 27 therebetween. For example, the adhesion 28 may be pressure-sensitive adhesive, thermal-sensitive adhesive, conductive epoxy, or non-conductive epoxy. Preferably, the air gap 27 will be between about 5 to 35 microns thick.

FIG. 6 shows an alternative application in which one substrate 20 has a layer of patterned graphene 22, while the other substrate 21 has a layer 26 of conductive film thereon. As in FIG. 5, the two substrates are bonded together with graphene or conductive layers facing each other. Preferably, the conductive layer 26 may comprise Copper, Gold, TiW, Silver, Palladium, or Aluminum. The graphene pattern 22 and/or 24 in FIGS. 5 and 6 may be a stack-up of electrodes or electrolytes.

The circuit board of the present disclosure provides improved electrical and thermal conductivity and chemical resistance. Graphene has excellent properties in many aspects including: better electrical conductivity than silver and improved thermal conductivity over copper. It has been found in one experiment that graphene's thermal conductivity goes to roughly 5300 watts/degree Kelvin, while copper's thermal conductivity is approximately 390 watts/degree Kelvin. Furthermore, graphene offers very good chemical resistance compared to materials commonly used in the flexible substrate field.

While an air gap cannot provide electrical connection, when a finger press is applied on an application of the graphene circuits with air gap, the air gap will be closed by the finger press and electrical connection will be realized through contact of surface 22 with surface 24 or 26. The graphene on a flexible substrate provides excellent flexibility and durability due to its thinner profile than the conventional circuit board. The thickness of this flexible circuit board can be thinner, down to 10 μm. It also can be bent easily and can conform well to its final shape without bounce back.

Although the preferred embodiment of the present disclosure has been illustrated, and that form has been described in detail, it will be readily understood by those skilled in the art that various modifications may be made therein without departing from the spirit of the disclosure or from the scope of the appended claims.

What is claimed is:

1. A graphene circuit board comprising:
   two core dielectric substrates having graphene patterns thereon wherein said two substrates are bonded together wherein an air gap is formed therebetween and wherein at least one of said core dielectric substrates further comprises one or more conductive metal layers on a side of said substrate opposite to said side having said graphene patterns thereon.

2. The graphene circuit board according to claim 1 wherein said two substrates each have graphene patterns on the sides facing each other.

3. The graphene circuit board according to claim 1 wherein a first of said two substrates has graphene patterns on the side facing the other substrate and wherein a second of said two substrates has a conductive layer on a side facing said first substrate.

4. The graphene circuit board according to claim 3 wherein said conductive layer comprises Copper, Gold, TiW, Silver, Palladium, or Aluminum.

5. The graphene circuit board according to claim 1 wherein said graphene patterns are electrodes or electrolytes.

6. The graphene circuit board according to claim 1 wherein said core dielectric substrates comprise Polyimide (PI), Liquid Crystal Polymer (LCP), polyester (PET), polyethylene-naphthalate (PEN), laminates of epoxies or Bismaleimide-Triazine resin (BT), Teflon, modified Teflon, ceramic, or Cyclo-olefin Polymers (COP).

7. The graphene circuit board according to claim 1 wherein said conductive metal layers comprise copper (Cu), Silver (Ag), Palladium (Pd), Aluminium (Al), Titanium-Tungsten (TiW), and/or Gold (Au).

8. The graphene circuit board according to claim 1 wherein each of said core dielectric substrates has a thickness of between about 2 and 200 μm and wherein said graphene patterns have a thickness of between about 0.3 and 3 nm.

9. The graphene circuit board according to claim 1 further comprising a bonding layer between said graphene patterns and said first core dielectric layer-substrate wherein said bonding layer comprises a thermoset adhesive film reinforced with fibers.

10. The graphene circuit board according to claim 9 wherein a surface of said bonding layer facing said graphene patterns has a roughened surface.

11. The graphene circuit board according to claim 1 wherein said two substrates are bonded together with pressure-sensitive adhesive, thermal-sensitive adhesive, conductive epoxy, or non-conductive epoxy.

12. The graphene circuit board according to claim 1 wherein said graphene circuit board is used in wearable electronic devices, fingerprint sensors, flexible displays, or touch screen panels.

13. A graphene circuit board comprising:
two core dielectric substrates having graphene patterns thereon wherein said two substrates are bonded together wherein an air gap is formed therebetween and wherein a bonding layer lies between said graphene patterns and said core dielectric substrate.

14. The graphene circuit board according to claim 13 wherein said two substrates each have graphene patterns on the sides facing each other.

15. The graphene circuit board according to claim 13 wherein a first of said two substrates has graphene patterns on the side facing the other substrate and wherein a second of said two substrates has a conductive layer on a side facing said first substrate.

16. The graphene circuit board according to claim 15 wherein said conductive layer comprises Copper, Gold, TiW, Silver, Palladium, or Aluminum.

17. The graphene circuit board according to claim 13 wherein said graphene patterns are electrodes or electrolytes.

18. The graphene circuit board according to claim 13 wherein said core dielectric substrates comprise Polyimide (PI), Liquid Crystal Polymer (LCP), polyester (PET), polyethylene-naphthalate (PEN), laminates of epoxies or Bismaleimide-Triazine resin (BT), Teflon, modified Teflon, ceramic, or Cyclo-olefin Polymers (COP).

19. The graphene circuit board according to claim 13 wherein at least one of said core dielectric substrates further comprises one or more conductive metal layers on a side of said substrate opposite to said side having said graphene patterns thereon, wherein said conductive metal layers comprise copper (Cu), Silver (Ag), Palladium (Pd), Aluminium (Al), Titanium-Tungsten (TiW), and/or Gold (Au).

20. The graphene circuit board according to claim 13 wherein each of said core dielectric substrates has a thickness of between about 2 and 200 µm and wherein said graphene patterns have a thickness of between about 0.3 and 3 nm.

21. The graphene circuit board according to claim 13 wherein said bonding layer comprises a thermoset adhesive film reinforced with fibers.

22. The graphene circuit board according to claim 21 wherein a surface of said bonding layer facing said graphene patterns has a roughened surface.

23. The graphene circuit board according to claim 13 wherein said two substrates are bonded together with pressure-sensitive adhesive, thermal-sensitive adhesive, conductive epoxy, or non-conductive epoxy.

24. The graphene circuit board according to claim 13 wherein said graphene circuit board is used in wearable electronic devices, fingerprint sensors, flexible displays, or touch screen panels.

* * * * *